United States Patent
Hyvonen et al.

(10) Patent No.: US 9,761,585 B2
(45) Date of Patent: Sep. 12, 2017

(54) MACRO TRANSISTOR DEVICES

(71) Applicant: INTEL CORPORATION, Santa Clara, CA (US)

(72) Inventors: Sami Hyvonen, Beaverton, OR (US); Jad B. Rizk, Portland, OR (US); Frank O'Mahony, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/425,393

(22) Filed: Feb. 6, 2017

(65) Prior Publication Data
US 2017/0148791 A1    May 25, 2017

Related U.S. Application Data

(63) Continuation of application No. 13/976,081, filed as application No. PCT/US2011/060652 on Nov. 14, 2011, now Pat. No. 9,564,430.

(51) Int. Cl.
*H01L 27/088* (2006.01)
*H01L 27/12* (2006.01)
(Continued)

(52) U.S. Cl.
CPC ...... *H01L 27/0886* (2013.01); *H01L 27/1211* (2013.01); *H01L 29/42376* (2013.01);
(Continued)

(58) Field of Classification Search
CPC ............. H01L 27/0886; H01L 27/1211; H01L 29/785; H01L 29/93; H01L 29/42376; H03L 7/099
See application file for complete search history.

(56) References Cited

U.S. PATENT DOCUMENTS 5,986,478 A * 11/1999 Ohashi ................ H01L 27/0207
257/E27.06
6,046,956 A * 4/2000 Yabe ................... G11C 11/4085
365/189.09
(Continued)

FOREIGN PATENT DOCUMENTS

TW          523648       3/2003
TW          I274370      2/2007
WO       2013074076 A1   5/2013

OTHER PUBLICATIONS

Kalra, et al., "Impact of Flash Annealing on Performance and Reliabilly of High-k/Metal-Gate MOSFETs for sub-45nm CMOAS," IEEE, Electron Device Meeting, Dec. 10-12, 2007, pp. 353-356.
(Continued)

*Primary Examiner* — William Coleman
(74) *Attorney, Agent, or Firm* — Finch & Maloney PLLC (57) ABSTRACT

Macro-transistor structures are disclosed. In some cases, the macro-transistor structures have the same number of terminals and properties similar to long-channel transistors, but are suitable for analog circuits in deep-submicron technologies at deep-submicron process nodes. The macro-transistor structures can be implemented, for instance, with a plurality of transistors constructed and arranged in series, and with their gates tied together, generally referred to herein as a transistor stack. One or more of the serial transistors within the stack can be implemented with a plurality of parallel transistors and/or can have a threshold voltage that is different from the threshold voltages of other transistors in the stack. Alternatively, or in addition, one or more of the serial transistors within the macro-transistor can be statically or dynamically controlled to tune the performance characteristics of the macro-transistor. The macro-transistors can (Continued)

be used in numerous circuits, such as varactors, VCOs, PLLs, and tunable circuits.

20 Claims, 7 Drawing Sheets

(51) Int. Cl.
  *H01L 29/423*    (2006.01)
  *H01L 29/78*    (2006.01)
  *H01L 29/93*    (2006.01)
  *H03L 7/099*    (2006.01)

(52) U.S. Cl.
  CPC ............ *H01L 29/785* (2013.01); *H01L 29/93* (2013.01); *H03L 7/099* (2013.01)

(56) References Cited

U.S. PATENT DOCUMENTS

| | | | |
|---|---|---|---|
| 6,211,659 B1 | 4/2001 | Singh | |
| 6,490,221 B2* | 12/2002 | Furutani | G11C 7/1072 365/200 |
| 6,509,796 B2* | 1/2003 | Nguyen | H03F 1/3211 330/254 |
| 6,978,437 B1* | 12/2005 | Rittman | G06F 17/5081 250/492.3 |
| 7,223,667 B2 | 5/2007 | Tseng | |
| 7,560,798 B2* | 7/2009 | Nowak | H01L 29/93 257/312 |
| 7,700,417 B2 | 4/2010 | Yang et al. | |
| 7,710,207 B2 | 5/2010 | Wu | |
| 7,859,903 B1* | 12/2010 | Wang | G11C 16/0483 365/185.11 |
| 9,564,430 B2 | 2/2017 | Hyvonen et al. | |
| 2002/0172070 A1* | 11/2002 | Arimoto | G11C 7/18 365/149 |
| 2004/0136253 A1 | 7/2004 | Gupta et al. | |
| 2007/0093008 A1* | 4/2007 | Choi | H01L 29/93 438/171 |
| 2009/0254870 A1* | 10/2009 | Kojima | G06F 17/5077 716/132 |
| 2010/0025811 A1* | 2/2010 | Bronner | H01L 21/67103 257/528 |
| 2013/0215683 A1* | 8/2013 | Lee | G11C 16/0466 365/185.29 |
| 2014/0008732 A1 | 1/2014 | Hyvonen et al. | |

OTHER PUBLICATIONS

International Search Report and Written Opinion received for PCT Patent Application No. PCT/US2011/060652, dated Aug. 29, 2012. 10 pages.
Suh, et al., "Programmable ANaolg Device Array: A Platform toward Transistor-Level Reconfigurable Analog Design," PANDA: Transistor-Level Analog Emulation, Sep. 9, 2011. 40 pages.
Pederson, "Performance Evaluation of CMOS Varactors for Wireless RF Applications," RISC Group, Aalborg University, Maxon Cellular Systems (Denmark) A/S, Dec. 1999. 6 pages.
Bunch, et al., "Large-signal analysis of MOS Varactors in CMOS-Gm LC VCOs," IEEE Journal of Solid-State Circuits, vol. 38, No. 8, Aug. 2003. pp. 1325-1332.
Zheng, et al., "Programmable ANalog Device Array (PANDA): A Platform for Transistor-Level Analog Reconfigurability," School of Electrical, Computer and Energy Engineering, Arizona State University, Jun. 5-10, 2001. pp. 322.327.
International Preliminary Report on Patentability and Written Opinion received for PCT Patent Application No. PCT/US2011/060652, dated May 30, 2014, 7 pages.
Office Action received for Taiwan Patent Application No. 101141365, dated Oct. 30, 2014, 5 pages of English Translation and 6 pages of Office Action.
Office Action received for Taiwan Patent Application No. 101141365, dated Apr. 15, 2015, 7 pages of English Translation and 10 pages of Office Action.
Office Action received in Taiwan Patent Application No. 101141365, dated Oct. 30, 2015, 17 pages.

\* cited by examiner

MACRO TRANSISTOR DEVICES

RELATED APPLICATONS

This application is a Continuation Application of U.S. application Ser. No. 13/976,081, filed Sep. 24, 2013 (now U.S. Pat. No. 9,564,430), which is a U.S. National Phase of International Application PCT/US2011/060652 filed Nov. 14, 2011. Each of these applications is herein incorporated by reference in its entirety.

BACKGROUND

Integrated circuit design in the deep-submicron process nodes (e.g., 45 nm and beyond) involves a number of non-trivial challenges, and circuits incorporating microelectronic components such as transistors or varactors have faced particular complications at these levels, particularly with respect to optimal device parameters and circuit performance. As process scaling advances further, these non-trivial problems and limitations will become more significant.

BRIEF DESCRIPTION OF THE DRAWINGS

FIG. 8D illustrates the schematic circuit of the macro-transistor structures shown in FIGS. 8A-8C.

DETAILED DESCRIPTION

Macro-transistor structures are disclosed. In some cases, the macro-transistor structures have the same number of terminals and properties (e.g., higher $R_{out}$ and lower device-to-device variation) similar to long-channel transistors, but are suitable for analog circuits in deep-submicron technologies at deep-submicron process nodes (e.g., 45 nm, 32 nm, 22 nm, and smaller). The macro-transistor structures can be implemented, for instance, with a plurality of transistors constructed and arranged in series, and with their gates tied together, generally referred to herein as a transistor stack. One or more of the serial transistors within the stack can be implemented with a plurality of parallel transistors and/or can have a threshold voltage that is different from the threshold voltages of other transistors in the stack. Alternatively, or in addition, one or more of the serial transistors within the macro-transistor can be statically or dynamically controlled to tune the performance characteristics of the macro-transistor. The macro-transistor structures can be used in any number of applications, such as those where short-gate transistors having relatively high $R_{out}$ are desired. The macro-transistor structures can also be used, for instance, to improve varactor characteristics.

General Overview

As previously indicated, there are a number of non-trivial issues that arise in fabricating semiconductor devices in deep-submicron process levels (e.g., 45 nm and beyond), and circuits incorporating microelectronic components such as transistors or varactors have faced particular complications at these levels, particularly with respect to optimal device parameters and circuit performance. For example, such complications include reduced output resistance ($R_{out}$) and increased variation of p-type metal-oxide-semiconductor (PMOS) and n-type metal-oxide-semiconductor (NMOS) transistors in analog circuits, and reduced tuning range of MOS varactors.

The issue of low output resistance for transistors might be addressed, for instance, by using long gate lengths. However, process scaling may tend to limit the ability to arbitrarily choose the gate length. In 45 nm process nodes, for instance, a range of gate lengths is available for analog use, but the longest available gate length may be too short for sufficient analog performance (depending on demands of the desired analog application). Active feedback can be used to improve the output resistance, but increases power consumption. Cascoding can also be used, but typically requires generation of a cascode bias voltage, which may increase circuit complexity. The issue of reduced capacitance tuning range for varactors remains unaddressed and unsolved, and will likely become a significant problem, for instance, on 14 nm process nodes and beyond, as well as with respect to varactors implemented with FinFET technology.

Thus, and in accordance with an embodiment of the present invention, transistor stacks (transistors electrically connected in series, and with their gates tied together) are employed to create macro-transistor structures that have improved transistor performance characteristics relative to conventional transistor structures. For instance, in some embodiments, the macro-transistor structure is configured with properties similar to long-channel transistors, including higher $R_{out}$ or reduced effective parasitic capacitance at the gate, and better matching from macro-transistor to macro-transistor (relative to the matching of standard individual short-channel transistors), but yet are amenable to implementation at deep-submicron process nodes (e.g., 45 nm and smaller). In any given embodiment, the stack may include two, three, four, or more serial transistors and any number of parallel transistors (e.g., zero, one, two, three, or more). At least one of the transistors in the stack effectively acts as a degeneration device, in accordance with some embodiments. Further note that the macro-structures, in accordance with some embodiments, include the stacking of individual transistors to make a functional macro-transistor that has the same number of terminals (e.g., source, drain, gate, and body/bulk) as a single transistor, but with enhanced performance characteristics relative to an individual transistor.

In some embodiments, one or more of the serial transistors in the stack are implemented with a plurality of parallel transistors, where the drains are connected together, the sources are connected together, and the gates are connected together thereby forming a parallel transistor array. In such a case, note that the serial-parallel arrangement can be implemented in an asymmetric or symmetric fashion. For instance, in a stack of six serial transistors, one of the transistors can be implemented with nine parallel transistors. In another example case, each of the transistors in a three transistor stack can be implemented with three parallel transistors. In another example case, one of the transistors in a four transistor stack can be implemented with three parallel transistors and a second of the transistors in the four transistor stack can be implemented with eight parallel transistors. Numerous asymmetric or symmetric arrangements will be apparent in light of this disclosure.

In some embodiments, one or more of the serial and/or parallel transistors in the stack can be configured with threshold voltages ($V_t$) that are different from the $V_t$ associated with other transistors in the stack. As the current through all transistors is equal, the respective overdrives ($V_{gs}-V_t$) of the transistors are roughly equal. However, as some of the $V_t$ values are different in such an embodiment, the required gate-to-source voltage ($V_{gs}$) values are also different. For instance, a low-$V_t$ transistor requires less $V_{gs}$ than a high-$V_t$ transistor. Such a macro-transistor structure allows for stack skewing and can provide a cascode-like effect, but doesn't require a need to generate a cascode bias voltage (or the relevant additional circuitry). In addition, as the $V_t$ differences within the transistor stack are largely insensitive to process, voltage and temperature (PVT) corners, this structure provides a relatively simple but PVT robust way to further improve $R_{out}$.

In some embodiments, static and/or dynamic control signals are employed to control one or more transistors in the stack so as to allow for adjusting individual properties of the macro-transistor. Such tuning can be used, for instance, to compensate for PVT or random variation.

Note that the individual transistors (or parallel arrays) making up the macro-transistor don't have to be physically close to each other, as long as they are electrically connected as described here. For instance, a parallel array within the stack (e.g., at the top of the stack) can be physically separated from the rest of the transistors in the stack (e.g., such as those at the bottom of the stack). In one example such case, the parallel array can be placed somewhere relatively nearby (e.g., a row above or below the rest of the stack) or at an otherwise arbitrary distance from the rest of the stack to which it is connected. In a more general sense, there is no physical proximity requirement for any transistor within a macro-transistor device configured in accordance with an embodiment of the present invention (e.g., some transistors of a given stack can be located on one chip and the other transistors of that same stack can be located on another chip).

Any number of applications will be apparent in light of this disclosure. In one specific example, use of multiple transistors configured in a macro-transistor structure as described herein can be used to increase the capacitance ratio of a varactor configuration. In more detail, with device scaling, the capacitance ratio of varactors, which refers to the ratio of maximum capacitance and minimum capacitance of a given varactor, is decreasing with every generation due to, for instance, constraints on gate length. This is a significant problem, for example, in inductor-capacitor based voltage controlled oscillators (LC-VCO) applications, such as the case with LC-VCOs for clock generation in phase lock loop (PLL) applications where frequency tuning can be difficult.

In some example embodiments, the macro-transistor structure can be implemented as a metal-oxide-semiconductor field effect transistor (MOSFET) device formed on a bulk substrate or a silicon-on-insulator (SOI, both partially-depleted and fully-depleted SOI) substrate. Other embodiments may be implemented with other transistor technology (e.g., bipolar junction transistors, heterojunction bipolar transistors, XOI where X is a semiconductor material other than silicon such as germanium or germanium-enriched silicon, etc). In addition, the techniques and structures provided herein can be applied in any process node, but the benefits are amplified in deep-submicron process nodes, particularly 45nm and smaller. As will be appreciated in light of this disclosure, the claimed invention is not intended to be limited to any particular transistor technology (e.g., MOSFET, SOI MOSFET, etc.), or any particular process nodes and half-nodes (e.g., 10 µm, 800 nm, 65 nm, 45 nm, 32 nm, 22 nm, 14 nm, 11 nm, etc). As will be further appreciated, both planar and non-planar (e.g., FinFET) transistor architectures can be implemented. In short, embodiments of the present invention can be implemented with any transistor technology and at any process nodes. The macro-transistors or current sources provided herein can be used, for instance, for various analog circuit applications, such as varactors, high speed interconnects and servers, digital-to-analog converters (DACs), operational amplifiers, volatile and non-volatile memories, and microprocessors and central processing units (CPUs). More generally, the disclosed techniques and structures may be implemented in any integrated circuitry that employs transistors. Numerous applications will be apparent in light of this disclosure.

Macro-Transistor Device

Figure 1:
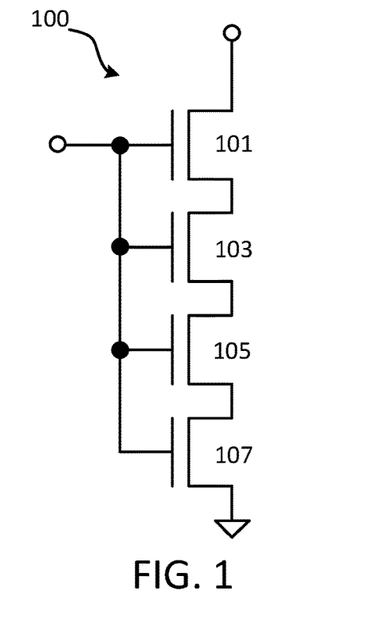
FIG. 1 is a schematic of a series macro-transistor, configured in accordance with an embodiment of the present invention.

FIG. 1 schematically illustrates a macro-transistor 100, configured in accordance with an embodiment of the present invention. As can be seen, transistors 101, 103, 105, and 107 are electrically connected in series, and their individual gates are connected to one another, thus forming a transistor stack. Although this example embodiment includes four distinct serial transistors, fewer (two or three) or additional serial transistors may be constructed and arranged to form the stack.

Each transistor symbol represents a single gate. As the current through the transistors 101, 103, 105, and 107 is basically equal, their $V_{gs}$ values are nearly equal. As a result, the bottom three transistors 103, 105, and 107 are in linear operating region, while only the top transistor 101 is in saturation. The bottom three transistors 103, 105, and 107 act as degeneration resistors for the top transistor 101, thereby improving $R_{out}$ and matching (from one device 100 to another device 100). In general, the degenerative effect of the transistors down the stack reduces the impact of variation in the top transistor of the stack.

The transistors of this example embodiment are implemented with MOSFETs, and can be fabricated using standard or custom MOSFET process techniques and materials. For example, the gate material can be poly-silicon, metal or other suitable gate material. The source and drain can be silicon, silicon-germanium (SiGe), or other suitable source/drain material. As previously indicated, the transistors may be implemented, for instance, with planar or FinFET architecture, and may employ bulk or XOI substrate configurations. As will be appreciated in light of this disclosure, the claimed invention is not intended to be limited to any particular semiconductor materials or fabrication processes or transistor architectures; rather, the macro-transistor devices described herein can be implemented with most any suitable integrated transistor circuit fabrication processes and can beneficially operate with most any suitable material systems and architectures.

Figure 2:
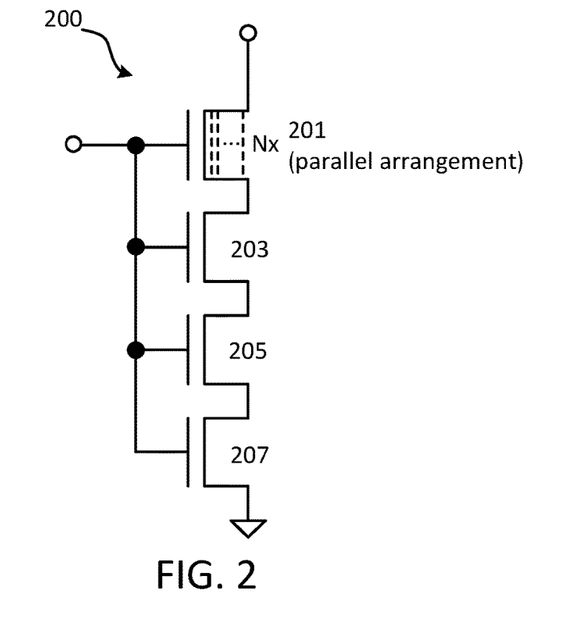
FIG. 2 is a schematic of a parallel-series macro-transistor, configured in accordance with an embodiment of the present invention.

FIG. 2 schematically illustrates a parallel-series macro-transistor 200, configured in accordance with an embodiment of the present invention. As can be seen, the top transistor 201 is an array of N parallel transistor gates, while the other three transistors 203, 205, and 207 are single gate transistors. The value for N can be two or more, and in one specific embodiment is six. Although this specific example embodiment includes one multiple-transistor parallel array and three distinct single transistors, fewer or additional arrays and/or single transistors may be constructed and arranged to form device 200.

In this example case, the current through the bottom three gates (transistors 203, 205, and 207) is basically equal so their $V_{gs}$ values are nearly equal, but the N-gate parallel combination on top (transistor 201) has less current per gate, requiring a lower $V_{gs}$. Note that the parallel currents may be equal or not, depending on the resistances associated with the parallel gates.

Since all the gates of the stack are tied together, some drain-to-source voltage ($V_{ds}$) headroom for transistor 203 is provided thereby keeping transistor 203 in saturation, and the bottom two transistors 205 and 207 are still in linear operating region, acting as degeneration. The N-transistor parallel combination of 201 is also in saturation; as a result, the structure acts as a cascode, with the N-transistor parallel combination multiplying the $R_{out}$ of the three-transistor stack below (203/205/207) with its gain.

While this macro-transistor has cascode-like properties, it doesn't require a separate bias voltage, as all gates are tied together. Further note that this structure is distinct from a structure where a single switched gate (not tied to other gates) is placed under a very large parallel array (e.g., N>20). For instance, and in accordance with some such embodiments of the present invention, the stack of single-gate transistors increases the effective $V_{gs}$ of the overall structure, thereby relaxing the large-size requirement on the parallel transistor array, making it feasible, for instance, in high-speed and/or area-sensitive applications. Further note that macro-transistor 200 can be constructed and arranged so as to function as a single cascode, a double cascode, or other cascoding configurations.

Figure 3:
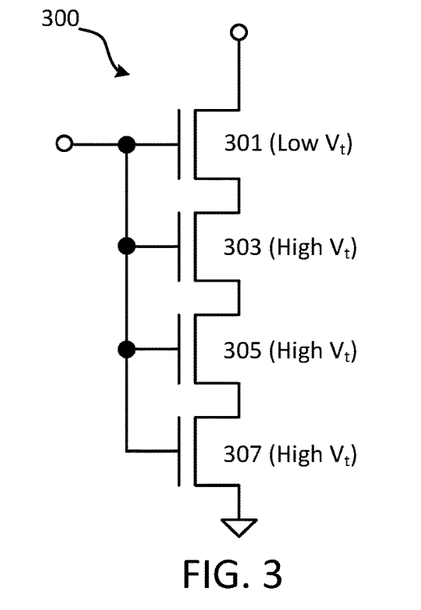
FIG. 3 is a schematic of a multi-threshold macro-transistor, configured in accordance with an embodiment of the present invention.

FIG. 3 is a schematic of a multi-threshold macro-transistor 300, configured in accordance with an embodiment of the present invention. In this example, all transistor symbols represent single gates, but the bottom three transistors 303, 305, and 307 have higher threshold voltages $V_t$ than the top transistor 301. Although this specific example embodiment includes one low $V_t$ transistor and three high $V_t$ transistors, other variations will be apparent in light of this disclosure.

As the current through all transistors is equal, their overdrives ($V_{gs}-V_t$) are roughly equal, but as different threshold voltages $V_t$ are employed, the required $V_{gs}$ values are also different. In particular, the low $V_t$ transistor needs less $V_{gs}$ than the other high $V_t$ transistors. As all gates are tied together, the lower $V_t$ of the top transistor 301 leaves some $V_{ds}$ headroom for transistor 303, keeping it in saturation. The bottom two transistors 305 and 307 are still in linear operating region, acting as degeneration. This creates a similar cascode-like effect as the structure shown in FIG. 2, while having a lower parasitic load at the output node (at the expense of a slightly higher headroom requirement). It doesn't require a separate cascode bias generation circuit, as $V_t$ differences are largely insensitive to PVT corners. As such, this example structure is a relatively simple but PVT robust way to improve $R_{out}$. Further note that macro-transistor 300 can be constructed and arranged so as to function as a single cascode, a double cascode, or other cascoding configurations.

Figure 4:
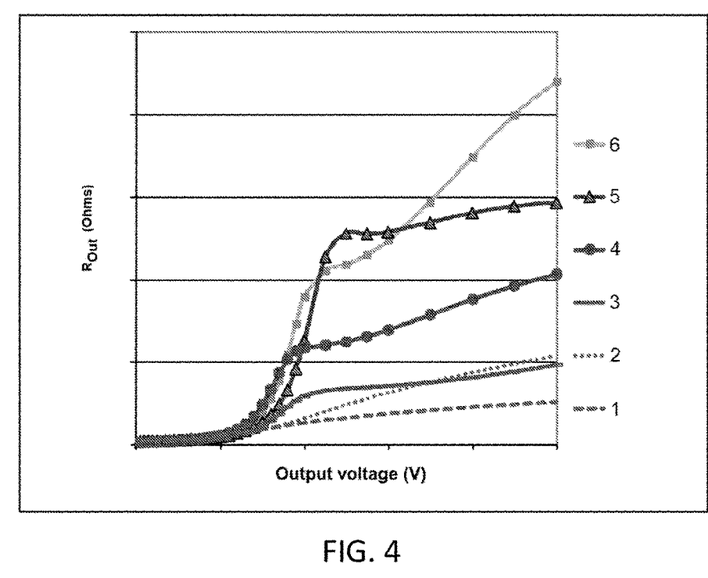
FIG. 4 is a graph of simulated results in a given process node showing output resistance as a function of output voltage.

FIG. 4 is a graph of simulated results for a given process node (e.g., 32 nm) showing $R_{out}$ as a function of output voltage. The data of plot #1 was generated by a single maximum-gate-length transistor. The data of plots #2-6, however, represent five different macro-transistors, each of which is configured in accordance with an embodiment of the present invention. The data of plot #2 was generated by a macro-transistor having a stack including two maximum-gate-length transistors electrically connected in series with their gates tied together, such as described with reference to the example embodiment of FIG. 1. The data of plot #3 was generated by a macro-transistor having a stack including four minimum-gate-length transistors electrically connected in series with their gates tied together, such as described with reference to the example embodiment of FIG. 1. The data of plot #4 was generated by a macro-transistor having a stack including two minimum-gate-length transistors with a 4-transistor parallel array on top, electrically connected in series with their gates tied together, similar to the example embodiment of FIG. 2 (but with one less transistor in the stack). The data of plot #5 was generated by a macro-transistor having a stack including three minimum-gate-length transistors with an 8-transistor parallel array on top, electrically connected in series with their gates tied together, similar to the example embodiment of FIG. 2. The data of plot #6 was generated by a macro-transistor having a stack including two minimum-gate-length transistors with a 4-transistor parallel array on top and an 8-transistor parallel array on top of the 4-transistor parallel array, electrically connected in series with their gates tied together. This is an example of an asymmetric double cascode configuration (in a symmetric configuration, both arrays would have the same number of parallel transistors). As can be seen from FIG. 4, the example macro-transistor structures associated with plots #2-6 generally exhibit an improved $R_{out}$ (relative to the transistor associated with plot 1) over the same range of output voltage, and in plots #4-6 $R_{out}$ is approximately 2 to 4 times higher. With respect to the macro-transistor having the double cascode configuration associated with plot #6, note that $R_{out}$ is almost 9 times higher than $R_{out}$ associated with the plot #1 configuration, at higher output voltages.

As can be further seen, the use of shortest gate-length devices significantly improves the $R_{out}$ of cascoded structures over longer-gate-length devices because of their very high transconductance. Although the circuit configurations shown here can be applied on both long-channel and short-channel transistor current sources, the benefit is most significant on short-channel transistors, providing much higher output resistances than what is achievable using long-channel devices, as shown in simulations of FIG. 4.

Dynamic Tuning

Figure 5A:
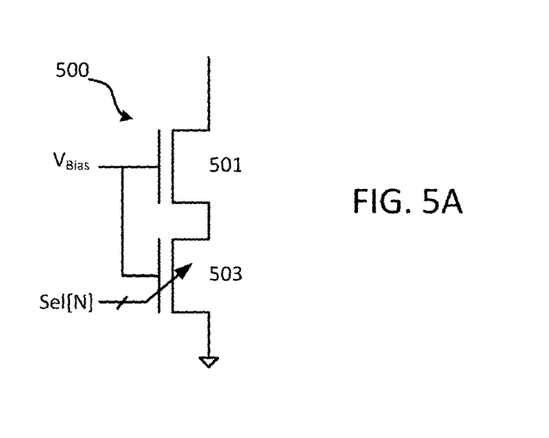
FIG. 5A is a schematic of a dynamically-tuned device, configured in accordance with an embodiment of the present invention.

The macro-transistor structures provided herein can also be arranged and configured to allow for tuning transistor performance post-fabrication process to compensate for process skews and/or variation. This can be done, for example, by using a dynamically tuned stack, as shown in FIG. 5A. Such dynamic tuning can be used, for instance, for achieving more uniform analog circuit behavior across process skews and may simplify the design process and/or conserve area and/or power.

The dynamically-tuned transistor stack 500 of this example embodiment includes a non-tunable device 501 which receives $V_{bias}$, and a tunable device 503 that is controlled by a digital select signal Sel[N]. Other embodiments may have additional tunable and/or non-tunable devices included in the stack 500, and still other embodiments may only include either tunable or non-tunable devices (but not necessarily both tunable and non-tunable). Any number of variations will be apparent in light of this disclosure, wherein one or more macro-transistor structures such as those discussed with reference to FIGS. 1 through 3 are employed in the stack 500.

In some embodiments, non-tunable device 501 is a single transistor and the tunable device 503 is a macro-transistor. Alternatively, non-tunable device 501 can be a macro-transistor and the tunable device 503 can be a single transistor. In still further embodiments, each of the non-tunable device 501 and the tunable device 503 can be a macro-transistor, or a combination of single transistors and macro-transistors. Thus, for instance, either device 501 or 503 (or both) may include a stack of transistors constructed and arranged in series with their gates tied together (in a similar fashion as discussed, for instance, with reference to FIG. 1). In some such cases, at least one of the transistors in a given stack may be configured as a parallel transistor array having two or more parallel transistors (in a similar fashion as discussed, for instance, with reference to FIGS. 2 and 4). In addition, or alternatively, at least one of the transistors in a given stack may be configured with a threshold voltage $V_t$ that is different from the $V_t$ of other transistors in that stack (in a similar fashion as discussed, for instance, with reference to FIG. 3).

Figure 5B:
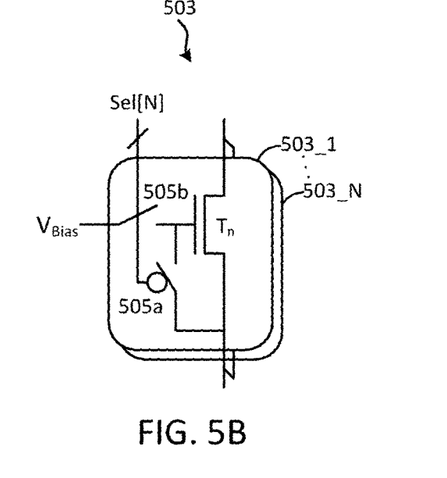
FIGS. 5B and 5C each schematically illustrate an example implementation of the tunable device shown in FIG. 5A, configured in accordance with an embodiment of the present invention.
Figure 5C:
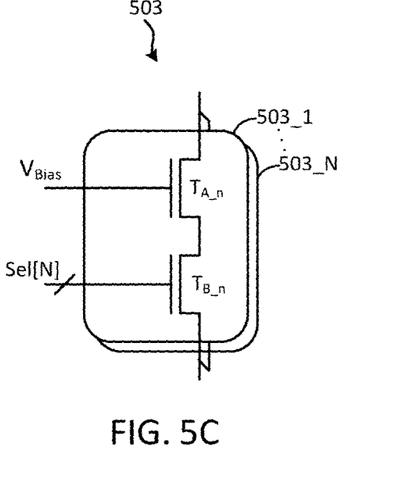

In the 2-stack example configuration of FIG. 5, the tunable device 503 operates as a degeneration device for the non-tunable device 501, and can be adjusted to produce a family of I-V curves at a fixed gate overdrive ($V_{g,od}$). There are a number of ways to implement this tunabilty, two examples of which are shown in FIGS. 5B and 5C, respectively. Other implementations will be apparent in light of this disclosure, and the present invention is not intended to be limited to any particular one.

The example configuration shown in FIG. 5B employs an array of N devices (503_1 to 503_N) with digitally-controlled bias levels. In this example case, a pair of complementary switches 505a and 505b (e.g., a 2:1 mux) in each of the N array elements operate in response to the digital select signal Sel[N] and either connect the gate of the corresponding tunable device $T_n$ (where n is an integer from 1 to N) to the bias voltage, $V_{bias}$, or shuts off the device $T_n$ by connecting the gate to source. The source and drain terminals of the arrayed devices (503_1 to 503_N) are connected together. Note that the array can be operatively connected (in series and/or parallel) with other such arrays and/or any other components or electrical terminations (ground, power supply, etc.) suitable to a given application.

The example configuration of FIG. 5C again uses an N array of devices (503_1 to 503_N), but in this case each element of the array includes a stack of two devices ($T_{A\_n}$, $T_{B\_n}$). As can be seen, $T_{A\_n}$ receives the analog bias ($V_{bias}$) and $T_{B\_n}$ is controlled by the digital select signal to enable or disable the array element. The previous relevant discussion with reference to FIG. 5B is equally applicable here (e.g., with respect to coupling of source and drain terminals in the array, etc.).

Figure 6:
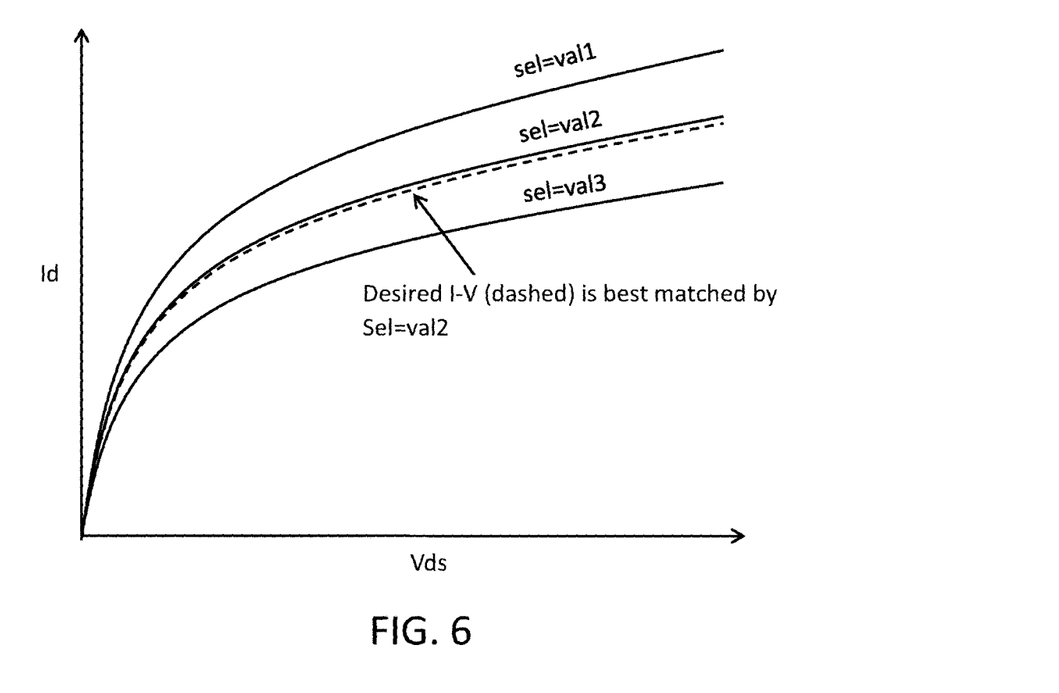
FIG. 6 demonstrate how the I-V curves of a dynamically-tuned device such as the one shown in FIGS. 5A-C can be digitally tuned to match a target I-V to compensate for process skews and variation, in accordance with an embodiment of the present invention.

Thus, by adjusting the quantity of transistors in an on-state in tunable device 503, the current through stack 500 may be raised and/or lowered to a target value (e.g., tunable device 503 may act like a potentiometer). Example I-V curves as a function of the digital select signal Sel[N] are shown in FIG. 6. As can be seen, the device array can be tuned toward a desired electrical characteristic (e.g., I-V curves, gm, rout) to compensate for process, voltage, and temperature (PVT) variation. The curves effectively show how the correct selection of tunable device 503 size can make the I-V curves for both a fast and slow skew lie almost perfectly on the I-V curve for the typical skew. In this example case, the desired I-V (designated with the dashed line) is best matched by Sel=val2. This technique can lead to more uniform analog circuit behavior, for instance.

In some embodiments, the digital select signal Sel[N] and/or $V_{bias}$ can be generated, for example, on-chip in conjunction with a process monitor circuit (for real-time or periodic tuning). In other embodiments, device 503 can be set based on an empirical assessment mechanism, or theoretical modeling (rather than actual in-circuit monitoring). Other embodiments may be tuned in a factory setting and with a given application in mind, and remain fixed thereafter. Numerous such configurations and device tuning scenarios will be apparent in light of this disclosure.

As will be appreciated in light of this disclosure, the disclosed techniques may be implemented, for example, with NMOS and/or PMOS circuits and may be combined and expanded to more elaborate current source structures. For example, the disclosed techniques may be implemented to configure two or more transistor parallel arrays stacked with different quantities of single transistors for a double cascode. As another example, the techniques disclosed herein may be implemented to operatively combine a stack of high-$V_t$ transistors with a transistor parallel array of low-$V_t$ transistors for extra cascoding. As a further example, the disclosed techniques may be implemented to form a stack of 10 or more transistors constructed and arranged in series, with their individual gates operatively connected together. Each of the many structures which may be configured via the disclosed techniques may be considered a macro-transistor and may exhibit improved performance characteristics as compared to conventional transistors.

Varactors

In general, varactor tuning range and capacitance ratio are being reduced with each generation of scaling due to limitations on gate length. This trend has significant implications for applications utilizing, for example, LC-VCO based PLLs for clock generation, where frequency tuning can be difficult.

Thus, and in accordance with one or more embodiments of the present invention, macro-transistors may be implemented, for example, to improve varactor capacitance ratio and/or to reduce the impact of parasitic capacitances on varactor capacitance tuning range. For instance, macro-transistors constructed and arranged in accordance with embodiments of the present invention may be utilized, for example, in high-speed applications, such as LC oscillators, peripheral component interconnect express (PCIe, such as PCIe Gen3), and high-speed input/output (e.g., QuickPath Interconnect, or QPI).

Figure 7A:
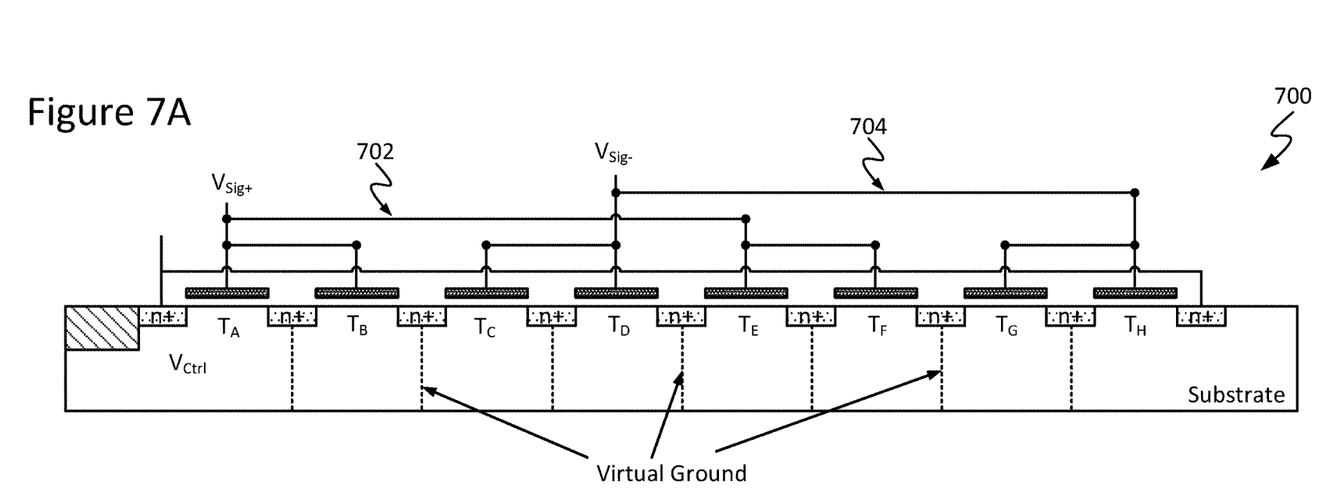
FIG. 7A is a schematic of NMOS macro-transistors in an n-well varactor configuration, in accordance with an embodiment of the present invention.
Figure 7B:
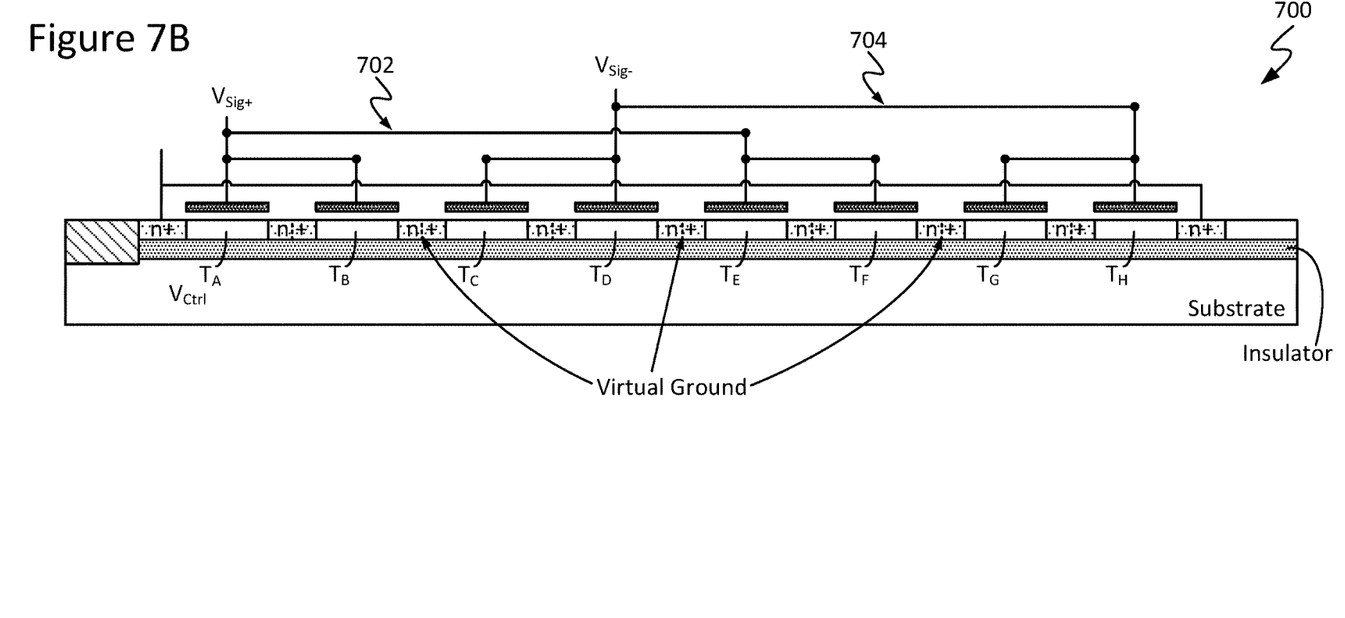
FIG. 7B is a schematic of NMOS macro-transistors in an n-well varactor configuration, in accordance with another embodiment of the present invention.

FIG. 7A is a schematic of NMOS macro-transistors in an n-well varactor 700, configured in accordance with one such example embodiment. FIG. 7B schematic of NMOS macro-transistors in an n-well varactor 700, configured in accordance with another such example embodiment. As can be seen, a first pair of NMOS macro-transistors (generally designated at 702) includes two series stacks of two transistors (one stack including $T_A$ and $T_B$, and the other stack including $T_E$ and $T_F$) all having their gates tied to $V_{sig+}$, and a second pair of NMOS macro-transistors (generally designated at 704) includes two series stacks of two transistors (one stack including $T_C$ and $T_D$, and the other stack including $T_G$ and $T_H$) all having their gates tied to $V_{sig-}$.

In this example configuration, the source and drain of the overall varactor device (the outer n-wells) are tied together and receive the control voltage, $V_{Ctrl}$. Note, however, that other embodiments may include other control schemes. For instance, the control voltage port of the differential varactor can be connected to the gate and/or drain and/or source terminal and/or bulk or body terminal of a given macro-transistor (e.g., it is not necessary for the macro-transistor drains or sources to be connected to a control voltage port; rather, the control voltage port can also be the device bulk/body node or the gate node and the drain/source nodes can be left unconnected). In the example embodiments of FIG. 7A and FIG. 7B, for instance, note that only one of the four macro-transistors has its drain connected to a control voltage (and, in the case of this NMOS in n-well device, this node is electrically the n-well bulk node). Numerous other control scheme configurations will be apparent. For example, an NMOS in n-well embodiment may include body control, a PMOS in n-well embodiment may be implemented with either diffusion or body control, and an NMOS in p-substrate embodiment may be implemented diffusion or body control. As will be further appreciated in light of this disclosure, NMOS in p-well and PMOS in p-well varactors may be implemented as well.

In the varactor configuration shown, the stacking is effective mainly in differential configuration where the parasitic capacitance between both the $V_{sig+}$ and $V_{sig-}$ ports is reduced, given that the corresponding n-well nodes of the varactor are virtual ground (and therefore not sensitive to any parasitic capacitance). While FIG. 7A and FIG. 7B each individually illustrate one specific example embodiment (i.e., in NMOS in an n-well varactor), implementation is also possible in standard NMOS or PMOS transistors. Furthermore, although this specific example embodiment includes four macro-transistors, other such embodiments may include fewer or additional macro-transistors.

Planar and Non-Planar Structures

As will be further appreciated in light of this disclosure, conventional processes and forming techniques can be used to fabricate the macro-transistors described herein in both planar and non-planar architectures, including FinFET transistor structure. A FinFET is a transistor built around a thin strip of semiconductor material (generally referred to as the fin). The transistor includes the standard field-effect transistor (FET) nodes, including a gate, a gate dielectric, a source region, and a drain region. The conductive channel of the device resides on/within the outer sides of the fin beneath the gate dielectric. Specifically, current runs along both sidewalls of the fin (e.g., sides perpendicular to the substrate surface), as well as along the top of the fin (e.g., side parallel to the substrate surface). Because the conductive channel of such configurations essentially resides along the three different outer, planar regions of the fin, such a FinFET design is sometimes referred to as a tri-gate FinFET. Other types of FinFET configurations are also available, such as so-called double-gate FinFETs, in which the conductive channel principally resides only along the two sidewalls of the fin (and not along the top of the fin).

Figures 8A, 8B:
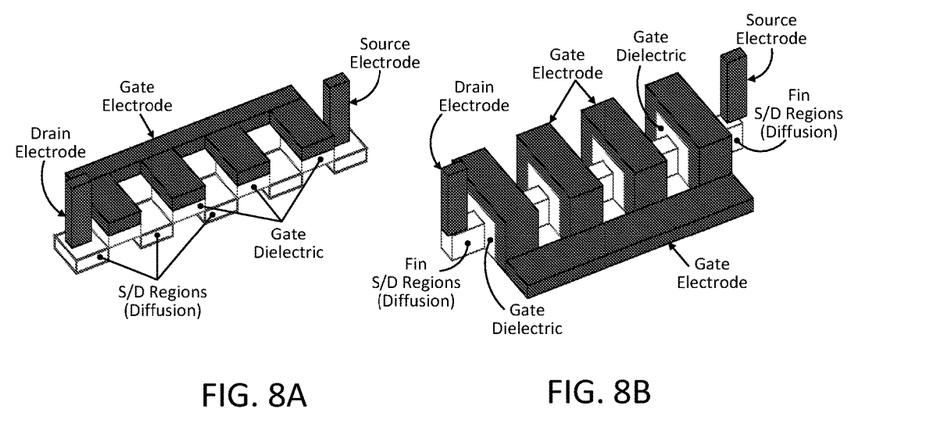
FIG. 8A illustrates a perspective view of a planar macro-transistor structure configured in accordance with an embodiment of the present invention.
FIG. 8B illustrates a perspective view of a non-planar macro-transistor structure configured in accordance with an embodiment of the present invention.

FIG. 8A illustrates a perspective view of a planar macro-transistor structure configured in accordance with an embodiment of the present invention. As can be seen, the planar device generally includes the standard FET nodes, including a gate, a gate dielectric, and a diffusion area (for the source and drain regions). The diffusion material can be any suitable semiconductor material, such as, for example, silicon or silicon germanium. The source and drain regions can be doped as typically done. For instance, in some cases, the source and drain regions can be formed using either an implantation/diffusion process or an etching/deposition process. In the former process, dopants such as boron, aluminum, antimony, phosphorous, or arsenic may be ion-implanted into the substrate to form the source and drain regions. The ion implantation process is typically followed by an annealing process that activates the dopants and causes them to diffuse further into the substrate. In the latter process, the substrate may first be etched to form recesses at the locations of the source and drain regions. An epitaxial deposition process may then be carried out to fill the recesses with a silicon alloy such as silicon germanium or silicon carbide, thereby forming the source and drain regions. In some implementations the epitaxially deposited silicon alloy may be doped in situ with dopants such as boron, arsenic, or phosphorous. In further implementations, alternate materials may be deposited into the recesses to form the source and drain regions, such as germanium or a group III-V material or alloy. The gate dielectric can be, for example, any suitable oxide such as $SiO_2$ or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. In some specific example embodiments, the high-k gate dielectric layer may have a thickness in the range of 5 Å to around 100 Å (e.g., 10 Å). In other embodiments, the gate dielectric layer may have a thickness of one monolayer of oxide material. In general, the thickness of the gate dielectric should be sufficient to electrically isolate the gate electrode from the neighboring source and drain contacts, until the desired breakdown (or programming) voltage is reached. In some embodiments, additional processing may be performed on the high-k gate dielectric layer, such as an annealing process to improve the quality of the high-k material. The gate electrode material can be, for example, polysilicon, silicon nitride, silicon carbide, or a metal layer (e.g., tungsten, titanium nitride, tantalum, tantalum nitride), although other suitable gate electrode materials can be used as well. The gate electrode material, which may be a sacrificial material that is later removed for a replacement metal gate (RMG) process, has a thickness in the range of 10 Å to 500 Å (e.g., 100 Å), in some example embodiments.

Source and drain electrodes can be may be configured with the same metal as the gate electrode, or another suitable electrode metal (e.g., aluminum, silver, gold, or an alloy thereof). Each of the gate dielectric, gate electrode, and source/drain electrode materials may be deposited using, for example, conventional deposition processes such as chemical vapor deposition (CVD), atomic layer deposition (ALD), spin-on deposition (SOD), or physical vapor deposition (PVD). Alternate deposition techniques may be used as well, for instance, the gate dielectric, gate electrode, and/or source/drain electrode materials may be thermally grown. As will be appreciated in light of this disclosure, any number of other suitable materials, geometries, and formation processes can be used to implement an embodiment of the present invention, so as to provide a macro-transistor device as described herein.

FIG. 8B illustrates a perspective view of a non-planar macro-transistor structure configured in accordance with an embodiment of the present invention. In particular, this example structure employs a FinFET architecture, and more specifically, a tri-gate architecture. As can be seen, the tri-gate device generally includes the standard FET nodes, including a gate, a gate dielectric, and a diffusion area (for the source and drain regions) configured with a fin as shown. As previously explained, the conductive channel of the device may reside on or otherwise within the outer sides of the fin beneath the gate dielectric, which may generally include two or three sides of the fin. The previous discussion with reference to example dimensions, materials and formation processes with respect to planar architectures is equally applicable to non-planar architectures.

Figure 8C:
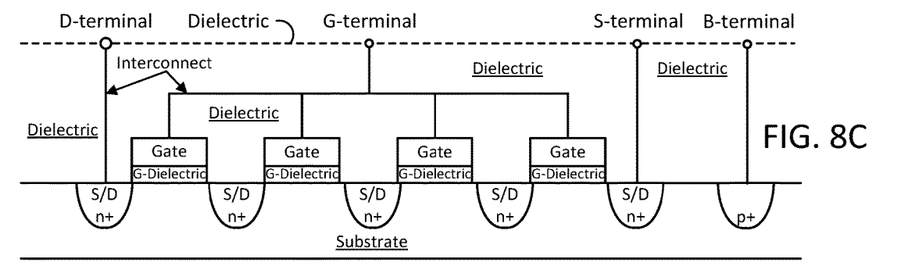
FIG. 8C illustrates a cross-section view of a macro-transistor structure configured in accordance with an embodiment of the present invention.

FIG. 8C illustrates a cross-section view of a macro-transistor structure configured in accordance with an embodiment of the present invention. The cross-section is taken across the middle of the diffusion. Incidentally, note that the cross-section looks similar for both the planar architecture of FIG. 8A and the FinFET architecture of FIG. 8B across that particular cross-section axis. Variations will be apparent. For instance, the FinFET architecture may have slightly taller diffusions.

Figure 8D:
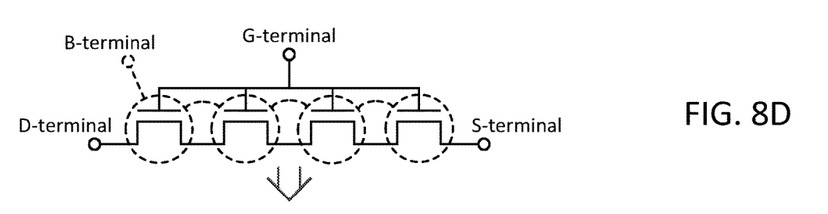
Figure 8E:
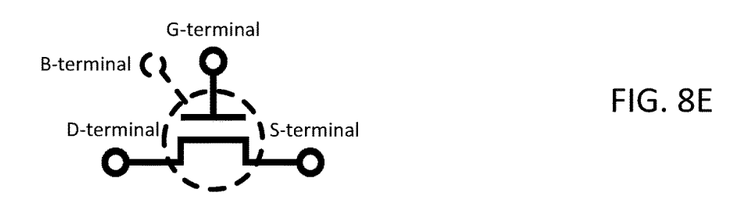
FIG. 8E shows how the macro-transistor structure can be a four terminal MOSFET device, in accordance with an embodiment of the present invention.

FIG. 8D illustrates the schematic circuit of the macro-transistor structures shown in FIGS. 8A-8C, and FIG. 8E shows how the macro-transistor structure can be a four terminal MOSFET device, in accordance with an embodiment of the present invention. As will be appreciated, the bulk/body terminal can be internally connected to the source terminal, but other configurations may be used. For instance, in some applications configured with a plurality of MOSFETs, the MOSFETs can share a bulk/body connection, which is not connected to the source terminals of all the MOSFETs. Any number of variations will be apparent in light of this disclosure, and the claimed invention is not intended to be limited to a particular set of terminals (e.g., 2-terminal device where drain, source and bulk terminals of the macro-transistor are tied together to form one capacitor node and the gate terminal of the macro-transistor forms the other capacitor node; 3-terminal device having source/drain/gate terminals, and 4-terminal device having source/drain/gate/bulk terminals).

Example System

Figure 9:
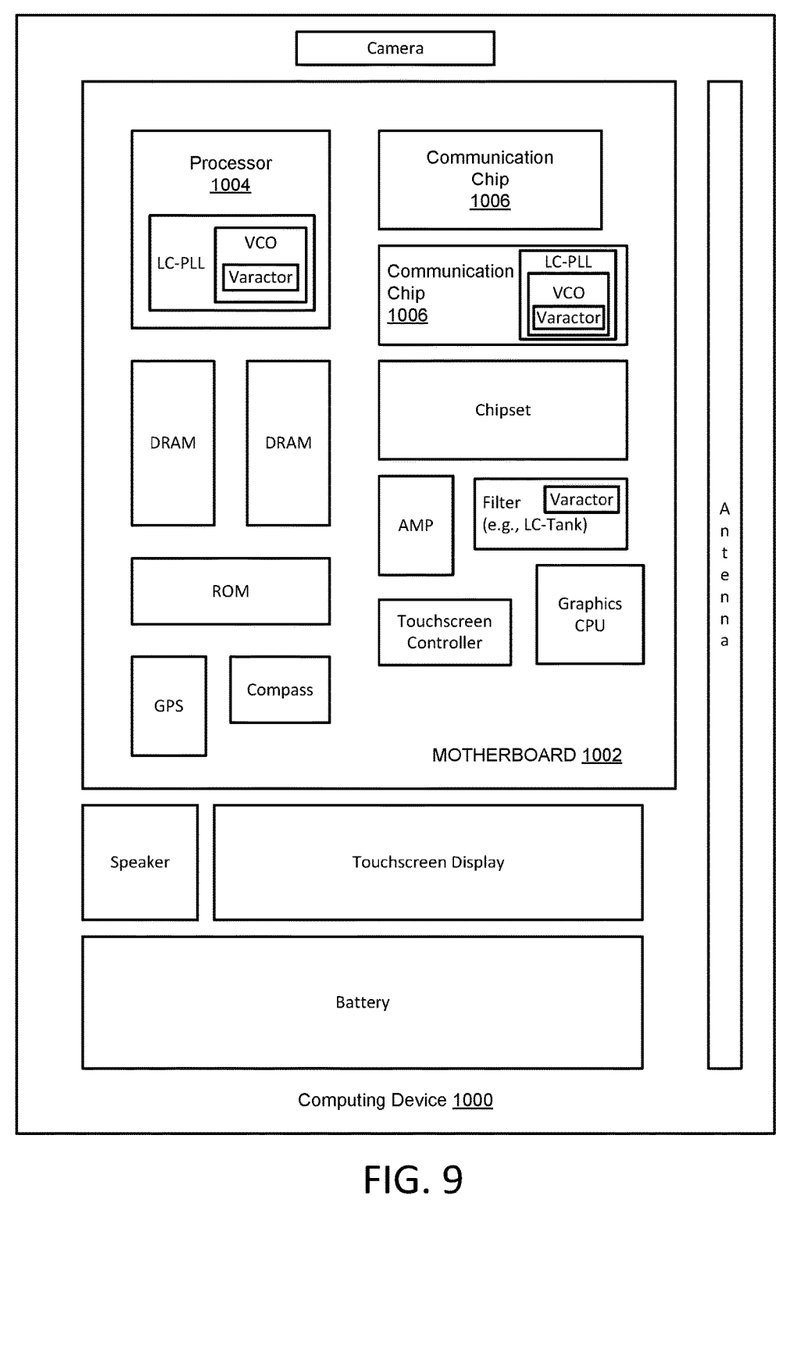
FIG. 9 illustrates a computing system implemented with one or more macro-transistor structures in accordance with an example embodiment of the present invention.

FIG. 9 illustrates a computing system 1000 implemented with one or more macro-transistor structures in accordance with an example embodiment of the present invention. As can be seen, the computing device 1000 houses a motherboard 1002. The motherboard 1002 may include a number of components, including but not limited to a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of device 1000, etc. Depending on its applications, computing device 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, one or more filters (e.g., LC-tank, high-pass, low-pass, bandpass filters), a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing device 1000 may include one or more macro-transistor structures as described herein. These macro-transistor structures can be used, for instance, to implement a voltage controlled oscillator or amplifier circuit. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some embodiments of the present invention, the integrated circuit die of the processor includes onboard LC-PLL circuitry that includes a VCO configured with a varactor to provide a variable capacitance to the LC-tank circuit and/or other typical or otherwise desired processor circuitry (e.g., amplifier, DAC, high-speed interconnect) that is implemented with one or more macro-transistor structures as described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip includes one or more devices implemented with one or more macro-transistor structures as described herein (e.g., on-chip LC-PLL having a VCO configured with a varactor and/or other on-chip circuitry suitable for macro-transistor technology). As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the device 1000 may be any other electronic device that processes data or employs macro-transistor devices.

Numerous embodiments will be apparent, and features described herein can be combined in any number of configurations. One example embodiment of the present invention provides a semiconductor integrated circuit. The circuit includes a plurality of transistors each having a source, drain and gate, the transistors electrically connected in series (a drain of one device is connected to a source of next device, etc) and with their respective gates tied together, wherein at least one of the transistors provides degeneration to at least one of the other transistors. In some cases, the circuit is implemented at a deep-submicron process node of about 45 nm or smaller. In some cases, the circuit has the same number of terminals as a single transistor. In some cases, the plurality of transistors comprises at least four transistors. In some cases, at least one of the transistors has a threshold voltage that is lower than the threshold voltage of at least one of the other transistors. In some cases, at least one of the transistors is implemented with a parallel transistor array. In some cases, at least two of the transistors are implemented with a parallel transistor array. In one such case, for instance, the parallel transistor arrays are asymmetric. In some cases, control signals control at least one of the transistors so as to allow for adjusting properties of the circuit. In some cases, the circuit is included in a tunable stack configuration including a tunable transistor device electrically connected in series with a non-tunable transistor device. In some such cases, the tunable transistor device provides degeneration to the non-tunable transistor device. In some such further cases, the tunable transistor device comprises a parallel array of transistors, and is configured to selectively pass a signal in response to at least one transistor in the array being turned on by a select signal. In some cases, the circuit comprises a bulk or silicon-on-insulator substrate. In some cases, the circuit is implemented with a planar transistor architecture. In some cases, the circuit is implemented with a FinFET architecture.

Any number of variations and configurations utilizing the semiconductor integrated circuit previously described can be implemented. For instance, in some cases, at least one of the transistors is implemented with a macro-transistor that comprises a plurality of transistors connected serially and/or in parallel, and the macro-transistor having the same number of terminals as an individual transistor. Another embodiment of the present invention provides a varactor comprising the semiconductor integrated circuit. Another embodiment of the present invention provides a voltage controlled oscillator comprising the semiconductor integrated circuit. Another embodiment of the present invention provides a phase lock loop comprising the semiconductor integrated circuit. Another embodiment of the present invention provides a dynamically-tuned device comprising the semiconductor integrated circuit. In one such case, the circuit is automatically adjustable using measurement circuitry included in the dynamically-tuned device.

Another embodiment of the present invention provides a semiconductor integrated circuit. The circuit includes a non-tunable transistor device and a tunable transistor array device electrically connected in series with the non-tunable transistor device. The tunable transistor array device is configured to selectively pass a signal in response to at least one element in the array device being turned on by a select signal. The tunable transistor array device provides degeneration to the non-tunable device. In one such case, at least one of the non-tunable and/or tunable transistor array devices comprise a plurality of individual transistors each having a source, drain and gate, the individual transistors electrically connected in series and with their respective gates tied together, wherein at least one of the individual transistors provides degeneration to at least one of the other individual transistors. In some cases, at least one of the individual transistors has a threshold voltage that is lower than the threshold voltage of at least one of the other individual transistors, and/or wherein at least one of the individual transistors is implemented with a parallel transistor array. In some cases, control signals control at least one of the individual transistors so as to allow for adjusting properties of the circuit.

Another embodiment of the present invention provides a semiconductor integrated circuit. The circuit includes a first macro-transistor configured with two or more transistors electrically connected in series and with their respective gates tied together to form a positive port of a differential varactor of the circuit, the first macro-transistor having source, drain, and gate terminals. The circuit further includes a second macro-transistor configured with two or more transistors electrically connected in series and with their respective gates tied together to form a negative port of the differential varactor, the second macro-transistor having source, drain, and gate terminals. The circuit further includes a control voltage port of the differential varactor operatively connected to at least one of the first and/or second macro-transistors (e.g., to provide control via the gate or diffusion control via drain and/or source, or body control if the macro-transistor further has a body/bulk terminal).

The foregoing description of the embodiments of the invention has been presented for the purposes of illustration and description. It is not intended to be exhaustive or to limit the invention to the precise form disclosed. Many modifications and variations are possible in light of this disclosure. For instance, note that macro-transistors themselves can also be stacked, connected in parallel, and otherwise implemented to build additional macro-transistors. In this sense, a macro-transistor can be considered a transistor device that can be used in any application individual transistors are used (including other macro-transistors). It is intended that the scope of the invention be limited not by this detailed description, but rather by the claims appended hereto.

What is claimed is:

1. A semiconductor integrated circuit, comprising:
a plurality of transistors each having a source region, a drain region, and a gate electrode, the transistors electrically connected in series and with their respective gate electrodes tied together, wherein at least one of the transistors provides degeneration to at least one of the other transistors;
wherein the transistors comprise planar transistor architecture, non-planar transistor architecture, or both planar and non-planar transistor architecture.

2. The semiconductor integrated circuit of claim 1 wherein the plurality of transistors forms a macro-transistor device that has the same number of terminals as a single transistor.

3. The semiconductor integrated circuit of claim 1 wherein the plurality of transistors comprises at least four transistors connected in series.

4. The semiconductor integrated circuit of claim 1 wherein at least one of the plurality of transistors has a threshold voltage that is lower than the threshold voltage of at least one of the other transistors.

5. The semiconductor integrated circuit of claim 1 wherein at least one of the plurality of transistors is a parallel transistor array.

6. The semiconductor integrated circuit of claim 1 wherein control signals control at least one of the transistors so as to allow for adjusting properties of the semiconductor integrated circuit.

7. The semiconductor integrated circuit of claim 1 wherein the semiconductor integrated circuit is included in a tunable stack configuration including a tunable transistor device electrically connected in series with a non-tunable transistor device, wherein the tunable transistor device provides degeneration to the non-tunable transistor device and comprises a parallel array of transistors and is configured to selectively pass a signal in response to at least one transistor in the array being turned on by a select signal.

8. The semiconductor integrated circuit of claim 1 wherein the semiconductor integrated circuit comprises a bulk semiconductor substrate, a semiconductor-on-insulator substrate, or bulk substrate and a semiconductor-on-insulator substrate.

9. The semiconductor integrated circuit of claim 1 wherein the semiconductor circuit comprises a planar transistor architecture, and gate length of at least one of the plurality of transistors is in one planar region of the semiconductor integrated circuit.

10. The semiconductor integrated circuit of claim 1 wherein the semiconductor integrated circuit comprises a FinFET architecture, and gate length of at least one of the plurality of transistors is in multiple planar regions of the semiconductor integrated circuit.

11. A varactor comprising the semiconductor integrated circuit of claim 1.

12. A voltage controlled oscillator comprising the semiconductor integrated circuit of claim 1.

13. A phase lock loop comprising the semiconductor integrated circuit of claim 1.

14. A dynamically-tuned device comprising the semiconductor integrated circuit of claim 1.

15. The semiconductor integrated circuit of claim 1 wherein at least one of the plurality of transistors is a macro-transistor that comprises one of multiple transistors connected in parallel, multiple transistors serially connected, or a combination of serially connected transistors and parallel connected transistors, the at least one of the plurality of the transistors having the same number of terminals as a single transistor.

16. A semiconductor integrated circuit, comprising:
a plurality of transistors each having a FinFET architecture and including a source region, a drain region, and a gate electrode, the transistors electrically connected in series and with their respective gate electrodes tied together, wherein at least one of the transistors provides degeneration to at least one of the other transistors;
wherein the plurality of transistors form a macro-transistor device that has the same number of terminals as a single transistor.

17. The semiconductor integrated circuit of claim 5 wherein the plurality of transistors includes a first parallel transistor array and a second parallel transistor array.

18. The semiconductor integrated circuit of claim 17 wherein the first parallel transistor array includes a number of transistors that is different from at least one of the number of serially connected transistors and the number of transistors included in the second parallel transistor array, wherein for purposes of the number of serially connected transistors a parallel transistor array counts as one transistor.

19. The dynamically-tuned device of claim 14 wherein the semiconductor integrated circuit is automatically adjustable by additional circuitry included in the dynamically-tuned device.

20. The semiconductor integrated circuit of claim 16 wherein at least one of:
at least one of the plurality of transistors has a threshold voltage that is lower than the threshold voltage of at least one of the other transistors; and/or
at least one of the plurality of transistors is a serial transistor array; and/or
at least one of the plurality of transistors is a parallel transistor array.

* * * * *